United States Patent
Naruko et al.

(10) Patent No.: US 11,580,196 B2
(45) Date of Patent: Feb. 14, 2023

(54) STORAGE SYSTEM AND STORAGE CONTROL METHOD

(71) Applicant: HITACHI, LTD., Tokyo (JP)

(72) Inventors: Takahiro Naruko, Tokyo (JP); Hiroaki Akutsu, Tokyo (JP); Akifumi Suzuki, Tokyo (JP)

(73) Assignee: HITACHI, LTD., Tokyo (JP)

(*) Notice: Subject to any disclaimer, the term of this patent is extended or adjusted under 35 U.S.C. 154(b) by 385 days.

(21) Appl. No.: 16/822,982

(22) Filed: Mar. 18, 2020

(65) Prior Publication Data

US 2020/0394256 A1    Dec. 17, 2020

(30) Foreign Application Priority Data

Jun. 12, 2019  (JP) .............................. JP2019-109585

(51) Int. Cl.
*G06F 17/18*      (2006.01)
*G06K 9/62*       (2022.01)
(Continued)

(52) U.S. Cl.
CPC ........... *G06F 17/18* (2013.01); *G06K 9/6256* (2013.01); *G06K 9/6265* (2013.01); *G06N 3/08* (2013.01); *H03M 7/30* (2013.01)

(58) Field of Classification Search
CPC .... G06F 17/18; G06K 9/6256; G06K 9/6265; G06N 3/08; G06N 3/0454; G06N 3/084;
(Continued)

(56) References Cited

U.S. PATENT DOCUMENTS 5,423,325 A * 6/1995 Burton ................... A61B 5/349
                                                600/515
6,011,868 A * 1/2000 van den Branden .... H04N 7/52
                                                375/228
(Continued)

FOREIGN PATENT DOCUMENTS

JP      2007-199891 A    8/2007

OTHER PUBLICATIONS

Extended European Search Report for related EP App No. 20163179.3 dated Sep. 23, 2020, 14 pgs.
(Continued)

*Primary Examiner* — Xuemei G Chen
(74) *Attorney, Agent, or Firm* — Procopio, Cory, Hargreaves & Savitch LLP

(57) ABSTRACT

A storage system that performs irreversible compression on time-series data using a compressor/decompressor based on machine learning calculates a statistical amount value of each of one or more kinds of statistical amounts based on one or more parameters in relation to original data (time-series data input to a compressor/decompressor) and calculates a statistical amount value of each of the one or more kinds of statistical amounts based on the one or more kinds of parameters in relation to decompressed data (time-series data output from the compressor/decompressor) corresponding to the original data. The machine learning of the compressor/decompressor is performed based on the statistical amount value calculated for each of the one or more kinds of statistical amounts in relation to the original data and the statistical amount value calculated for each of the one or more kinds of statistical amounts in relation to the decompressed data.

9 Claims, 13 Drawing Sheets

(51) Int. Cl.
*G06N 3/08* (2023.01)
*H03M 7/30* (2006.01)

(58) Field of Classification Search
CPC ...... G06N 20/00; H03M 7/30; H03M 7/3059; H03M 7/3079
See application file for complete search history.

(56) References Cited

U.S. PATENT DOCUMENTS

| | | | |
|---|---|---|---|
| 6,529,927 | B1 | 3/2003 | Dunham |
| 11,037,278 | B2* | 6/2021 | Zamir ................... G06N 20/00 |
| 2007/0174536 | A1 | 7/2007 | Nakagawa et al. |
| 2010/0150161 | A1* | 6/2010 | Saksena ................. H04L 47/12 370/400 |
| 2018/0275642 | A1* | 9/2018 | Tajima ................. G06N 3/0454 |
| 2019/0081637 | A1 | 3/2019 | Pool |
| 2019/0155684 | A1* | 5/2019 | Akutsu ................. G06F 3/0641 |
| 2019/0228110 | A1* | 7/2019 | Yan ..................... G06N 3/0454 |
| 2019/0247662 | A1* | 8/2019 | Poltroak ............. A61B 5/0816 |
| 2019/0251418 | A1* | 8/2019 | Nakanishi ............... G06N 3/08 |
| 2020/0210842 | A1* | 7/2020 | Baker ................... G06N 20/00 |
| 2021/0074036 | A1* | 3/2021 | Fuchs ................. G06N 3/0454 |
| 2021/0082444 | A1* | 3/2021 | Fejgin ..................... G10L 25/30 |
| 2022/0007084 | A1* | 1/2022 | Aytekin ............... G06N 3/0454 |

OTHER PUBLICATIONS

Aytekin, C., et al., A Compression Objective and a Cycle Loss for Neural Image Compression, May 24, 2019, arXiv:1905.10371, [online] [retreived Aug. 24, 2020] URL: https://arxiv.org/abs/1905.10371, 5 pgs.

Grover, A., et al., Uncertainty Autoencoders: Learning Compressed Representations via Variational Information Maximization, arxiv.org, Cornell University Library, 201 Olin Library Cornell University Ithaca, NY 14853, arXiv:1812.10539, Dec. 26, 2018, 19 pgs.

Makhzani, A., et al., k-Sparse Autoencoders, arXiv:1312.5663, Mar. 22, 2014, 9 pgs., [retrieved Sep. 1, 2015] [online] URL: https://arxiv.org/abs/1312.5663.

Ng, A., Sparse Autoencoder, CS294A/CS294W Deep Learning and Unsupervised Feature Learning Winter 2011 Lecture Notes, Dec. 31, 2011, Stanford, CA, 19 pgs., [online] [retrieved Aug. 25, 2020] URL: https://web.stanford.edu/class/cs294a/sparseAutoencoder.pdf.

wikipedia.com, Autoencoder, Jun. 11, 2019, [online] [retrieved Aug. 25, 2020] 7 pgs., URL: https://en.wikipedia.org/w/index.php?title=Autoencoder&oldid=901360758.

* cited by examiner

FIG. 2

| | KIND OF STATISTICAL AMOUNT | SENSOR | NUMBER OF SAMPLES | STATISTICAL FREQUENCY | ... |
|---|---|---|---|---|---|
| STATISTICAL AMOUNT 1 | MEAN | A | 100 | 100 | |
| STATISTICAL AMOUNT 2 | MEAN | B | 100 | 100 | ... |
| STATISTICAL AMOUNT 3 | DISPERSION | B | 200 | 50 | |

STATISTICAL AMOUNT PARAMETER SETTING SCREEN

COMPLETE

FIG. 5

STATISTICAL AMOUNT PARAMETER MANAGEMENT TABLE

|  | KIND OF STATISTICAL AMOUNT | SENSOR | NUMBER OF SAMPLES | STATISTICAL FREQUENCY | ... |
|---|---|---|---|---|---|
| STATISTICAL AMOUNT 1 | MEAN | A | 100 | 100 | |
| STATISTICAL AMOUNT 2 | MEAN | B | 100 | 100 | ... |
| STATISTICAL AMOUNT 3 | DISPERSION | B | 200 | 50 | |
| ⋮ | ⋮ | | ⋮ | | |

*FIG. 6*

STATISTICAL AMOUNT QUALITY TABLE — 411

| | MEAN SQUARE ERROR (60_2) | MAXIMUM ERROR (60_2) | ... |
|---|---|---|---|
| STATISTICAL AMOUNT 1 (60_1) | 0.01 | 0.2 | |
| STATISTICAL AMOUNT 2 (60_1) | 0.01 | 0.3 | ... |
| STATISTICAL AMOUNT 3 (60_1) | 0.02 | 0.4 | |
| ⋮ | ⋮ | ⋮ | |

STORAGE SYSTEM AND STORAGE CONTROL METHOD

BACKGROUND OF THE INVENTION

1. Field of the Invention

The present invention generally relates to storage control for compressing and decompressing data.

2. Description of Related Art

A storage system reducing an amount of data is known (for example, JP 2007-199891A). The type of storage system generally reduces an amount of data by compressing the data. As one of the known compression methods, there is known a method of making text strings of which a frequency of appearance is high in predetermined block units as a dictionary and substituting the text strings with codes with smaller sizes, as in a run length method.

An irreversible compression technology is known as a technology for reducing an amount of data more than a reversible compression such as a run length method. For example, in U.S. Pat. No. 6,529,927B1, an amount of data is reduced by converting sensor data into a power spectrum and a phase spectrum and excluding values of power and a phase from a recording target at a frequency less than a threshold in which the power value is preset.

In analysis of the sensor data, in order to perform statistical analysis maintenance of a probability distribution (for example, a mean and a dispersion of noise) of data is requested as an accuracy requisite in some cases. In U.S. Pat. No. 6,529,927B1, however, when the maintenance of the probability distribution is given as the accuracy requisite, there is a problem that a compression ratio degrades. For example, sensor data including white noise will be assumed. In the technology disclosed in U.S. Pat. No. 6,529,927B1, when a power spectrum of the sensor data differs depending on a frequency band, the sensor data is compressed by destructing values of power and a phase in a frequency band with relatively smaller power. However, in white noise, power uniformly distributes in all the frequency bands. Therefore, when a statistical nature of the sensor data is maintained, a value of a specific frequency band is not destroyed and a compression ratio degrades in U.S. Pat. No. 6,529,927B1.

In recent years, a compressor/decompressor based on machine learning is known. As an example of such a kind of a compressor/decompressor, there is an autoencoder. The autoencoder includes a neural network and can learn data of a specific field to perform compression specialized in learning data and data of the same field.

In general, the neural network is learned so that a function value set in a loss function is small. In the neural network included in the compressor/decompressor, a function (an error function) that indexes an error between an input and an output is generally set as the loss function.

The inventors of the present specification have obtained the following knowledge as a thorough examination result of a storage system according to a comparative example in which an autoencoder is adopted as a compressor/decompressor.

When an error function set in the loss function differs from an error function according to the accuracy requisite, information unnecessary to satisfy the accuracy requisite remains in a compression result. As a result, a compression ratio degrades. For example, with regard to the sensor data, a case in which maintenance of a mean value per second as a statistical amount is an accuracy requisite is considered. To satisfy the accuracy requisite, when the sensor data is partitioned into windows for 1 second, it is enough for sums of values in windows to coincide with each other before and after compression and it is not necessary to record the individual windows. In this case, when a mean square error is set as an example of the loss function, information (for example, individual values in the windows) that has no influence on accuracy of a statistical amount is recorded in a compression result. As a result, the compression ratio degrades.

The foregoing problems can also arise in a case in which irreversible compression of time-series data other than sensor data is performed using a compressor/decompressor based on machine learning other than an autoencoder.

SUMMARY OF THE INVENTION

A storage system that performs irreversible compression on time-series data using a compressor/decompressor based on machine learning calculates a statistical amount value of each of one or more kinds of statistical amounts based on one or more parameters in relation to original data (time-series data input to a compressor/decompressor) and calculates a statistical amount value of each of the one or more kinds of statistical amounts based on the one or more kinds of parameters in relation to decompressed data (time-series data output from the compressor/decompressor) corresponding to the original data. The machine learning of the compressor/decompressor is performed based on the statistical amount value calculated for each of the one or more kinds of statistical amounts in relation to the original data and the statistical amount value calculated for each of the one or more kinds of statistical amounts in relation to the decompressed data.

According to an aspect of the invention, the information that has no influence on accuracy requisite which is accuracy of a statistical amount (that is, information other than information necessary to calculate the statistical amount) which is calculated based on one or more parameters can be excluded from a compression result (post-compression data). Therefore, in relation to the same accuracy requisite of the statistical amount, a compression ratio is improved more than in the comparative example.

BRIEF DESCRIPTION OF THE DRAWINGS

FIG. 2 is a diagram illustrating a configuration of a statistical amount parameter setting screen;

FIG. 5 is a diagram illustrating a configuration of a statistical amount parameter management table;

FIG. 6 is a diagram illustrating a configuration of a statistical amount quality management table;

DESCRIPTION OF EMBODIMENTS

Figure 1:
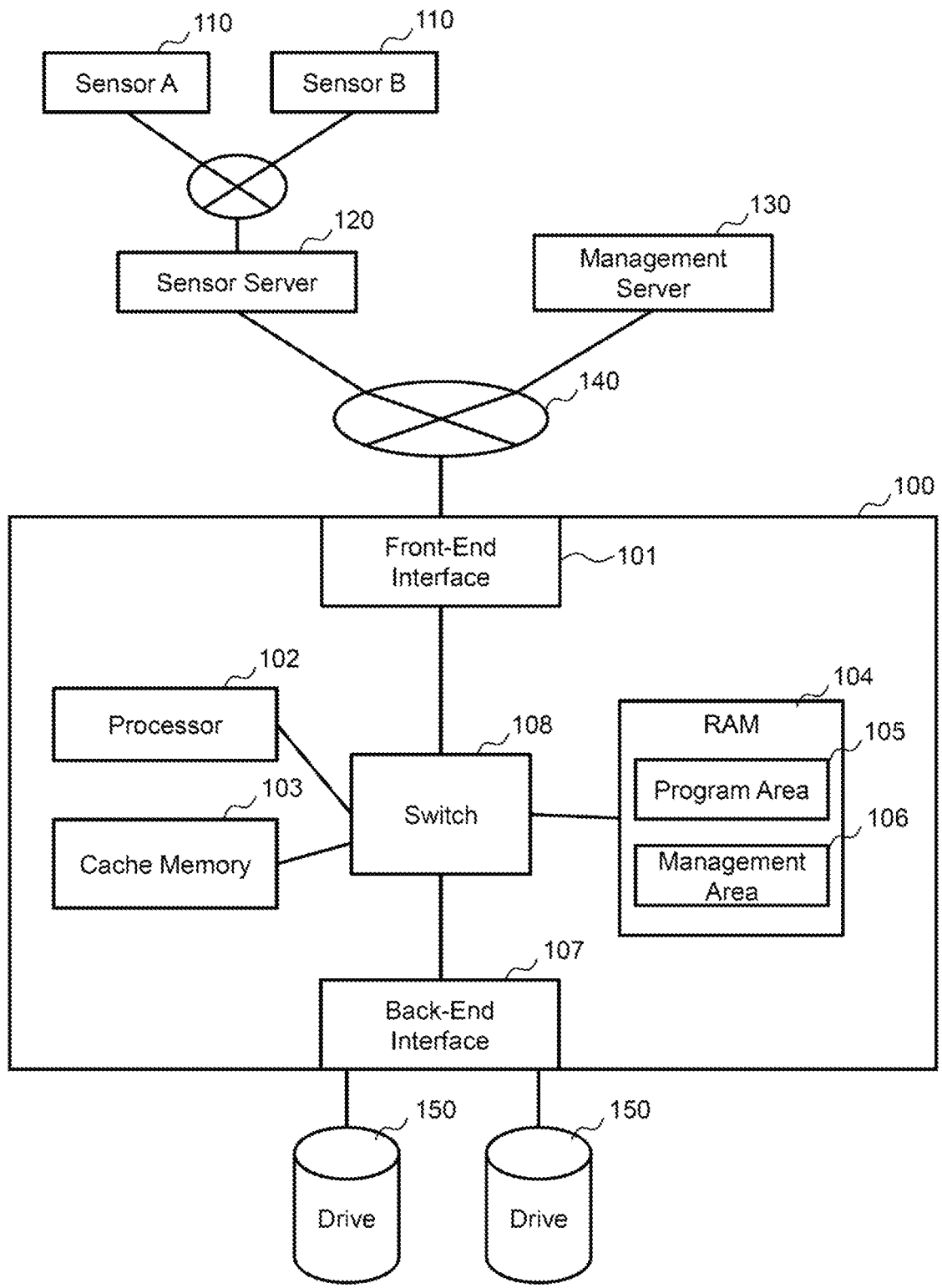
FIG. 1 is a diagram illustrating an overall configuration of a system according to an embodiment.

In the following description, an "interface device" may be one or more interface devices. The one or more interface devices may be at least one of the following devices:
one or more input/output (I/O) interface devices: an input/output (I/O) interface device is an interface device for at least one of an I/O device and a remote display calculator. The I/O interface device for the display calculator may be a communication interface device. At least one I/O device may be one of an input device such as a user interface device, for example, a keyboard and a pointing device and an output device such as a display device; and
one or more communication interface devices: one or more communication interface devices may be the same kind of one or more communication interface devices (for example, one or more network interface cards (NICs) or may be different kinds of two or more communication interface devices (for example, an NIC and a host bus adapter (HBA)).

In the following description, a "memory" is one or more memory devices and may be generally a main storage device. At least one memory device in the memory may be a volatile memory device or may be a nonvolatile memory device.

In the following description, a "persistent storage device" is one or more persistent storage devices. The persistent storage device is generally a nonvolatile storage device (for example, an auxiliary storage device) and is specifically, for example, a hard disk drive (HDD) or a solid-state drive (SSD).

In the following description, a "storage device" may be a physical storage device such as a persistent storage device or may be a logical storage device associated with a physical storage device.

In the following description, a "processor" is one or more processor devices. At least one processor device is generally a microprocessor device such as a central processing unit (CPU) and may be another type of processor device such as a graphics processing unit (GPU). At least one processor device may be a single core or may be a multi-core. At least one processor device may be a processor core. At least one processor device may be an extended processor device such as a hardware circuit (for example, a field-programmable gate array (FPGA) or an application specific integrated circuit (ASIC)) that performs some or all of the processes.

In the following description, in an expression such as a "xxx table," information in which an output is obtained for an input will be described. The information may be data that has any structure. Accordingly, the "xxx table" can be said to be "xxx information". In the following description, a configuration of each table is exemplary. One table may be divided into two or more tables. Some or all of two or more tables may be one table.

In the following description, a case in which a "program" is processed as a subject will be described. However, since a program is executed by a processor so that a given process is performed appropriately using a storage device and/or an interface device or the like, a subject of the process may be considered to be a processor (or a device including the processor). The program may be installed to a device such as a calculator from a program source. The program source may be, for example, a recording medium that can be read (for example, non-transitory) by a program distribution server or a calculator. In the following description, two or more programs may be realized as one program or one program may be realized as two or more programs.

In the following description, a "storage system" may be an on-premises storage system, may be a cloud storage system, or may be one or both of an edge system (for example, a system collecting data from a plurality of sensors) and a core system (for example, a system receiving data collected from a plurality of sensors from an edge system).

In the following description, an autoencoder is adopted as an example of a "compressor/decompressor," but a compressor/decompressor other than an autoencoder may be adopted. An example of the compressor/decompressor may be a data model. The data model may be one of a data generation rule, a model, and execution entity. For example, the data model may be a binary string expressing a mathematical expression process, a waveform shape, regularity of a probability distribution, or the like. In the data model, original data (time-series data before compression) may be set as an input and decompressed data (data obtained by decompressing the data after the original data is compressed) may be an output. In the data model, for example, a general neural network, a generation model (for example, a Gaussian mixture models (GMM), a hidden Markov model (HMM), a stochastic context-free grammar (SCFG), a generative adversarial nets (GAN), or a variational auto encoder (VAE)), genetic programming, or the like may be used. A model compression such as a mimic model may be applied to reduce an amount of information of the data model.

In the following description, sensor data that has a plurality of sensor data sets corresponding to a plurality of times is adopted as an example of the "time-series data". The "sensor data set" may be, for example, a data set that includes information indicating a sensor ID, a measured value, and a time (for example, a measurement time or a granted time stamp). The "data set" is one logical electronic data block viewed from a program such as an application program and may be, for example, one of a record, a file, a key value pair, and a tuple. The invention may be applied to time-series data other than the sensor data. For example, a set of images captured by a camera may be regarded as time-series data. In this case, data per time becomes a 3-dimensional tensor. In this case, the sensor data set is, for example, a data set including an ID of a camera, a 3-dimensional tensor indicating an image, and information indicating an imaging time.

Next, embodiments of the invention will be described with reference to the drawings. The invention is not limited to the embodiments to be described below.

(1) System Configuration

First, a system configuration to which the invention is applied will be described with reference to FIG. 1. FIG. 1 is a diagram illustrating an overview of an exemplary system to which the invention is applied. The invention can be applied to the system exemplified in FIG. 1.

A storage node 100, a sensor server 120, and a management server 130 are connected to a switch 140. The switch 140 connects the storage node 100, the sensor server 120, and the management server 130 to each other. The storage node 100, the sensor server 120, and the management server 130 may be independent computers, may be virtual computers such as different virtual machines operating on the same computer, or may be configured by a combination thereof. Each of the storage node 100, the sensor server 120, and the management server 130 may not necessarily be one node or server and may be configured by a plurality of nodes or servers. Instead of the switch 140, a communication network (for example, a local area network (LAN), a wide area network (WAN), or the Internet) may be adopted.

The sensor server 120 is a computer that includes hardware resources such as a processor, a memory, and an interface device and software resources such as drivers of sensors. The sensor server 120 aggregates data (sensor data sets) generated by one sensor or a plurality of sensors 110 and transmits the data to the storage node 100.

The management server 130 is a computer that includes hardware resources such as a processor, a memory, an interface device, and local input/output devices and software resources such as a management program. The management server 130 displays management screens illustrated in FIGS. 2 and 3 via a local output device (generally, a display device) in accordance with the management program. Further, the management server 130 has a function of responding with device setting input on a statistical amount parameter setting screen 200 (see FIG. 2) by a system user (for example, a manager) in response to a request from the storage node 100. The management server 130 may transmit an output to another computer connected by a network instead of including a local output device. Instead of including the local input device, an input may be received from another computer via the switch 140.

The storage node 100 includes a front-end interface 101, a processor 102, a cache memory 103, a RAM 104, a back-end interface 107, and a switch 108 connecting them to each other. The front-end interface 101 and the back-end interface 107 are examples of an interface device. The cache memory 103 and the RAM 104 are examples of a storage device (for example, a memory).

The front-end interface 101 is a device that connects the storage node 100 to the sensor server 120 and the management server 130 so that the storage node 100, the sensor server 120, and the management server 130 can communicate with each other via the switch 140.

The processor 102 controls the entire storage node 100 via the switch 108 based on one or more programs recorded in a program area 105 of the RAM 104 and management information recorded in a management area 106 of the RAM 104. The processor 102 may be an accelerator such as a GPU or an FPGA in addition to a general arithmetic processor such as a CPU or may be a combination thereof.

The cache memory 103 is a storage device that temporarily retains writing target data until a compression process is completed. The cache memory 103 may include a volatile element such as a dynamic random access memory (DRAM) or may be a nonvolatile drive such as an HDD or an SSD.

The back-end interface 107 is a device that connects the storage node 100 to the nonvolatile drive 150 such as an HDD or an SSD so that the storage node 100 and the nonvolatile drive 150 can communicate with each other.

The front-end interface 101, the processor 102, the cache memory 103, the RAM 104, and the back-end interface 107 described above may be configured as an ASIC or an FPGA by one semiconductor element or may be configured so that a plurality of individual integrated circuits (ICs) are connected to each other. The storage node 100 and the management server 130 may be constituent elements of the storage system or one or more drives 150 may be constituent elements of the storage system.

(2) Management Screen

FIG. 2 is a diagram illustrating a statistical amount parameter setting screen 200 output to a local output device of the management server 130.

The statistical amount parameter setting screen 200 is an example of a first interface (for example, a first user interface (UI)) and is, for example, a graphical user interface (GUI). The statistical amount parameter setting screen 200 includes a statistical amount parameter input field 201 and a completion button 204.

The statistical amount parameter input field 201 is an area of a table format in which a user is allowed to input a kind of statistical amount and a parameter. Each row 202 of the statistical amount parameter input field 201 corresponds to one combination of a kind of statistical amount and a parameter. Each column 203 of a statistical amount parameter input field corresponds to a kind of statistical amount or a parameter. An example of one combination is, for example, as follows:

In the column 203 of "kind of statistical amount," a kind of statistical amount such as a "mean" or "a dispersion" is input (hereinafter, referred to as a "target kind" in the paragraph);

In the column 203 of "sensor," an ID of a calculation target sensor of the statistical amount belonging to the target kind is input;

In the column 203 of "number of samples," the number of samples of a value used to calculate the statistical amount belonging to the target kind is input; and In the column 203 of "calculation frequency," a time interval at which the statistical amount belonging to the target kind is calculated is input.

The parameter items such as "number of samples" or "calculation frequency" are merely exemplary. Thus, parameter items other than the parameter items exemplified in FIG. 2 may be added or at least one of the exemplified parameter items may be omitted. The statistical amount parameter input field 201 may be mounted in an interface such as a drop-down list or a radio button in addition to an interface in which a user is allowed to designate a kind of statistical amount or a parameter in a text form. The statistical amount parameter setting screen 200 may allow a user to designate a kind of statistical amount and a parameter in accordance with a data description language such as a JavaScript Object Notation (JSON).

The completion button 204 is a button for receiving notification of completion of an input from a user (for example, a system user) to the statistical amount parameter input field 201.

Figure 3:
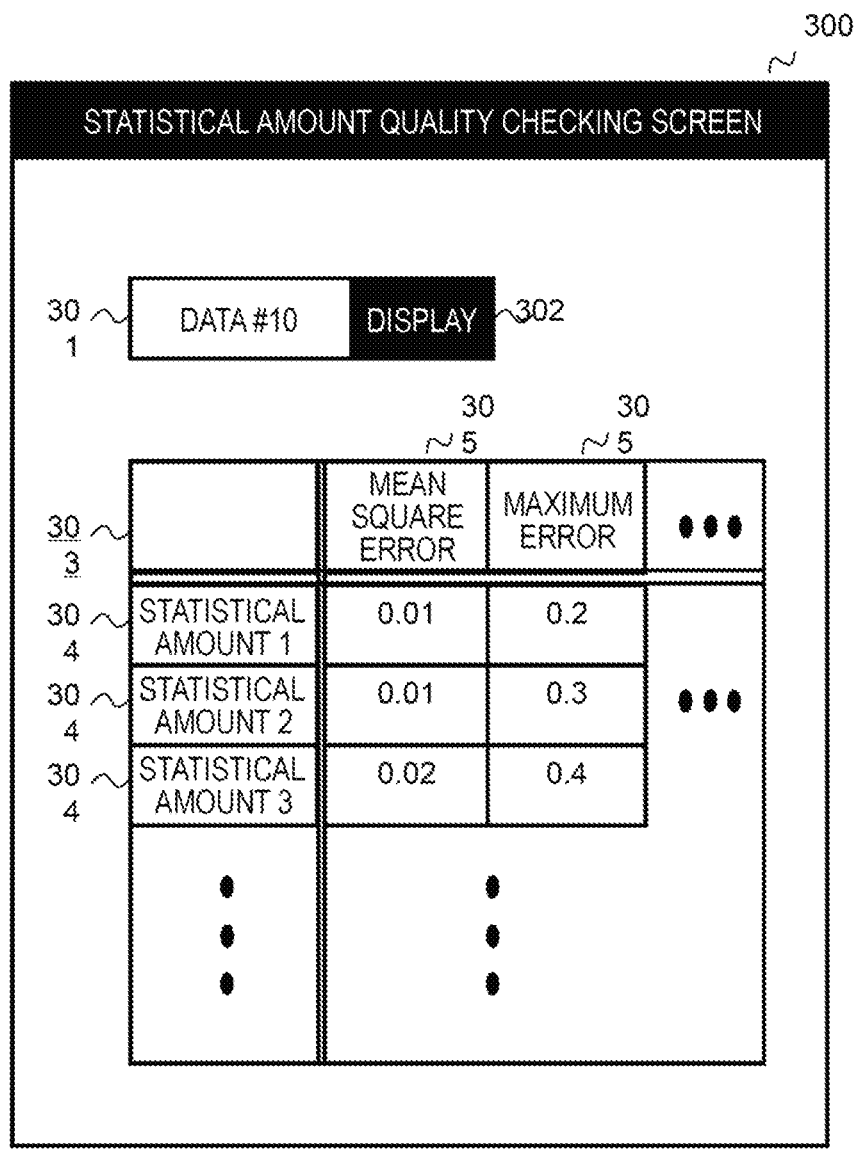
FIG. 3 is a diagram illustrating a configuration of a statistical amount quality checking screen.

FIG. 3 is a diagram illustrating a statistical amount quality checking screen 300 output to the local output device of the management server 130.

The statistical amount quality checking screen 300 is an example of a second interface (for example, a second UI) and is, for example, a graphical user interface (GUI). The statistical amount quality checking screen 300 is a screen on which the size of an error occurring due to compression with regard to each statistical amount designated in the statistical amount parameter input field 201 is displayed to a user. The statistical amount quality checking screen 300 includes a data ID input field 301, a display button 302, and a statistical amount quality field 303.

The data ID input field 301 is an input field for designating data in which an error of a statistical amount is displayed. In the data ID input field 301, a section of a time at which the sensor 110 generates data may be designated, a number indicating how many times the sensor server 120 transmits data to the storage node 100 may be designated, or any information for specifying a range of sensor data (an example of time-series data) may be designated.

The display button 302 is a button for allowing a user to decide information input to the data ID input field 301. When the display button 302 is pressed, the management server 130 transmits the information input to the data ID input field 301 to the storage node 100 and sets a value indicated by a response from the storage node 100 in the statistical amount quality field 303.

A row 304 of the statistical amount quality field 303 corresponds to a combination of a kind of statistical amount and a parameter. Therefore, the row 304 has a one-to-one correspondence with the row 202 of the statistical amount parameter input field 201. Each column 305 of the statistical amount quality field 303 corresponds to an error of the statistical amount (for example, various errors such as a mean square error and a maximum error) in the sensor data specified from the information input to the data ID input field 301. The indexing of the statistical amount is not limited to the exemplified mean square error and the maximum error. Any index may be added.

(3) Configuration of RAM

Figure 4:
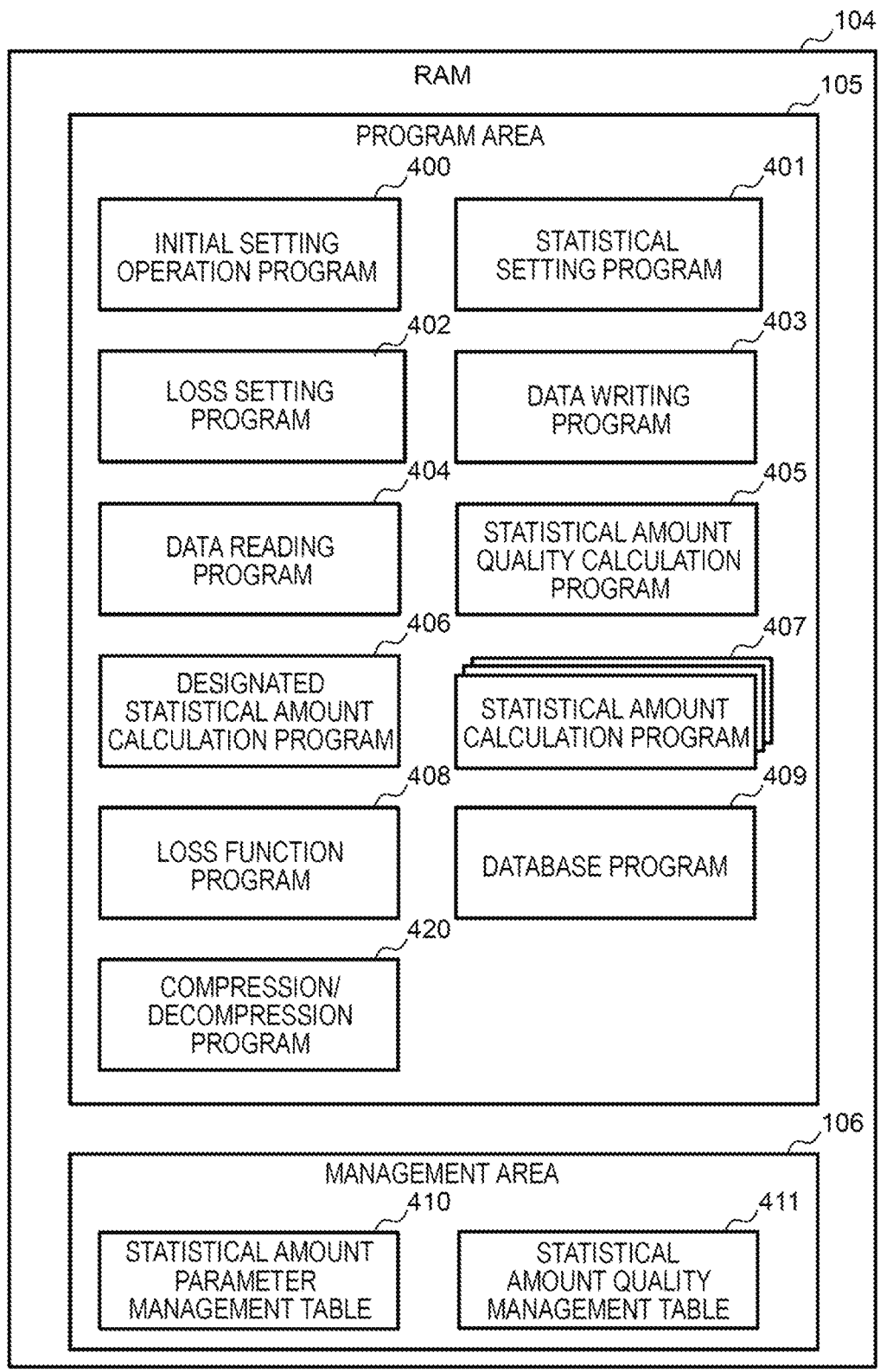
FIG. 4 is a diagram illustrating a configuration of a RAM.

FIG. 4 is a diagram illustrating a configuration of the RAM 104.

The RAM 104 includes the program area 105 in which a program executed by the processor 102 is stored and the management area 106 in which management information read and written by the processor 102 in response to a command of the program is stored.

One or more programs stored in the program area 105 include, for example, an initial setting operation program 400, a statistical setting program 401, a loss setting program 402, a data writing program 403, a data reading program 404, a statistical amount quality calculation program 405, a designated statistical amount calculation program 406, a statistical amount calculation program 407, a loss function program 408, a database program 409, and a compression/decompression program 420.

The initial setting operation program 400 initializes the management information. The statistical setting program 401 sets the designated statistical amount calculation program 406. The loss setting program 402 sets the loss function program 408.

The data writing program 403 performs learning of a compressor/decompressor, compression of writing target data, and writing of a compression result (post-compression data) in the nonvolatile drive 150 in response to a request from the sensor server 120.

The data reading program 404 reads the compression result from the nonvolatile drive 150 in response to a request from the sensor server 120, the management server 130, or the like, decompresses the data, and responds with the decompressed data.

The statistical amount quality calculation program 405 calculates an error occurring in the data due to a compression/decompression process with regard to the statistical amount designated by the user via the statistical amount parameter setting screen 200.

The designated statistical amount calculation program 406 is a program that calculates a value of the statistical amount designated by the user via the statistical amount parameter setting screen 200 with regard to the data given as an input to the program.

The designated statistical amount calculation program 406 sets the initial setting operation program 400 based on the statistical amount designated by the user on the statistical amount parameter setting screen 200.

The statistical amount calculation program 407 is a set of programs calculating statistical amounts such as a mean, a dispersion, and a median. The program receives parameters such as a target sensor, the number of samples, a calculation frequency in addition to the calculation target sensor data of the statistical amount as arguments. In general, the size of sensor data (for example, the number of sensor data sets that form the sensor data) is greater than the number of samples when the statistical amount is calculated. Therefore, at least one statistical amount calculation program 407 partition the sensor data into windows of the designated number of samples and calculates the statistical amount of each window. Therefore, values of a plurality of statistical amounts can be calculated from one piece of sensor data. Therefore, a return value of the statistical amount calculation program 407 generally becomes a tensor formed from the statistical amounts. The calculation of the statistical amount is not limited to calculation performed between data with different times. For example, when data at each time of time-series data is a tensor of an image or the like, a statistical amount of the tensor may be calculated. Each sensor may be divided into smaller tensors and a statistical amount of each sub-tensor may be calculated.

The loss function program 408 is a program that calculates a value of a loss function used to learn a neural network using the statistical amounts calculated by the designated statistical amount calculation program 406. The loss function program 408 is set to the time of initialization by the initial setting operation program 400.

The database program 409 is a program of software of a database managing the compression result. The database program 409 may have a function of writing the compression result in the plurality of nonvolatile drives 150 in a distributed manner or a function of storing data in the plurality of storage nodes 100 in a distributed manner when the number of storage nodes 100 is plural. The database program 409 may provide a function and an application programming interface (API) to provide storing and reading of data to other programs.

The compression/decompression program 420 provides a function of learning a neural network included in the compressor/decompressor for the sensor data using designated learning data and the loss function, a function of compressing the sensor data using the learned compressor/decompressor, and a function of decompressing the sensor data from the post-compression data. The compression/decompression program 420 may include a compressor/decompressor.

The management information stored in the management area 106 includes, for example, a statistical amount parameter management table 410 and a statistical amount quality management table 411. These tables may be mounted with a data structure other than a table, such as a hash table or a binary tree.

FIG. 5 is a diagram illustrating the statistical amount parameter management table 410.

The statistical amount parameter management table 410 retains parameters of the statistical amounts set by the user via the management server 130. Each row 501 of the statistical amount parameter management table 410 corresponds to each statistical amount designated by the user on the statistical amount parameter setting screen 200 of the management server 130. In a column 502 of the statistical amount parameter management table 410, a kind of statistical amount designated by the user on the statistical amount parameter setting screen 200 of the management server 130 is stored. Columns 503 of the statistical amount parameter management table 410 correspond to the parameters (for example, a calculation target sensor, the number of samples when the statistical amount is calculated, the calculation frequency of the statistical amount, and the like) of the statistical amounts designated by the user on the statistical amount parameter setting screen 200 of the management server 130.

FIG. 6 is a diagram illustrating the statistical amount quality management table 411.

The statistical amount quality management table 411 is a table in which a calculation result of the statistical amount quality calculation program is retained. Each row 601 of the statistical amount quality management table 411 corresponds to each statistical amount designated by the user in the management server 130. Each column 602 of the statistical amount quality management table corresponds to an index for measuring an error of a statistical amount preset in the storage node 100, such as a mean square error or a maximum error. The index is not limited to the mean square error or the maximum error. Any index calculated by a function that calculates one scalar value using two tensors as inputs may be used.

(4) Overview of Initial Setting Operation of Storage Node 100

Figure 7:
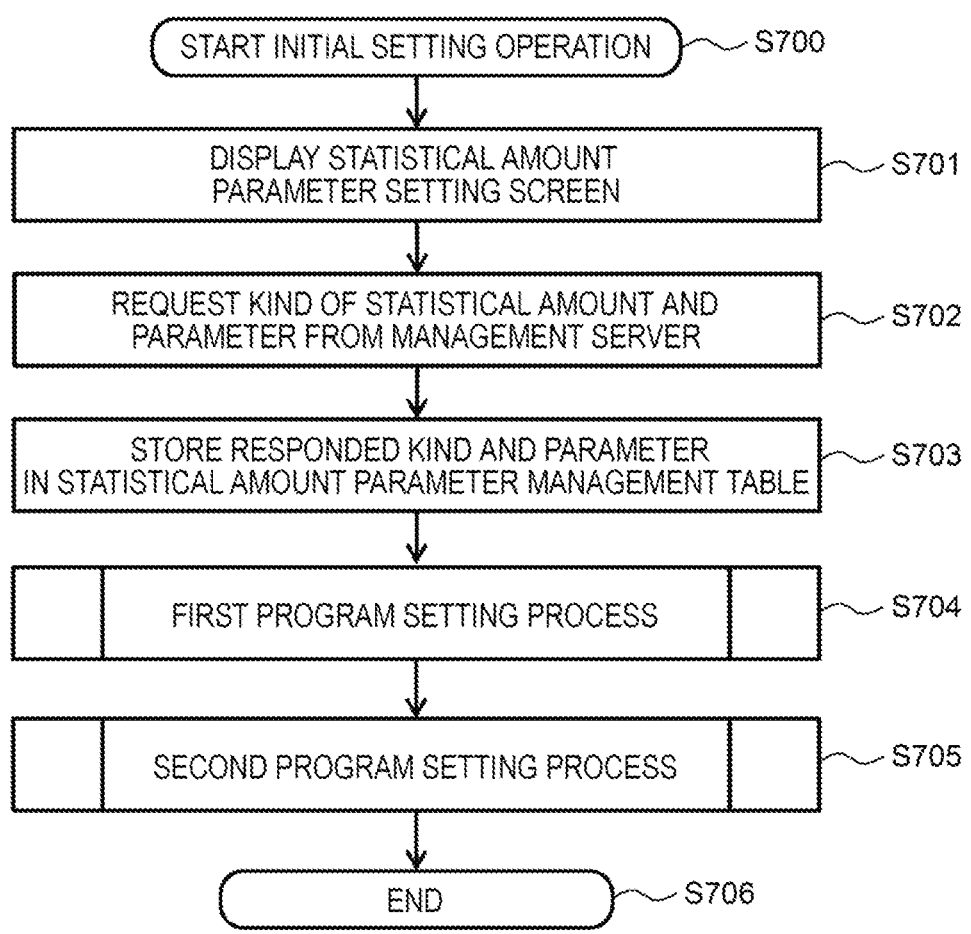
FIG. 7 is a flowchart illustrating an initial setting process.

FIG. 7 is a flowchart illustrating an initial setting process. The processor 102 starts the initial setting operation program 400 using first activation of the storage node 100, pressing of a reset button of the storage node 100 by the user, an instruction from the management server 130, or the like as a trigger (S700).

In S701, the processor 102 instructs the management server 130 to a process of displaying the statistical amount parameter setting screen 200 in the local output device via the switch 108, the front-end interface 101 and the switch 140. When the management server 130 receives the instruction, the management server 130 outputs the statistical amount parameter setting screen 200 to the local output device so that the user inputs a type of statistical amount and a parameter.

In S702, the processor 102 requests the value input to the statistical amount parameter input field 201 from the management server 130 to receive the responded value via the switch 108, the front-end interface 101, and the switch 140. In response to a request from the storage node 100, the management server 130 responds to the storage node 100 with the parameters in the statistical amount parameter input field 201 when the user presses the completion button 204. When the user does not press the completion button 204, the management server 130 waits until the user presses the completion button 204. When the completion button 204 is pressed, the management server 130 responds to the storage node 100 with the parameters in the statistical amount parameter input field 201. S702 is a step in which extraction of a pull type information in which the processor 102 requests the parameters from the management server 130 is assumed. However, instead of the extraction of the pull type information, extraction of push type information in which the management server 130 actively transmits the parameters to the storage node 100 may be adopted. In this case, the processor 102 may wait until the front-end interface 101 receives the parameters transmitted by the management server 130.

In S703, the processor 102 stores the parameters acquired in S702 in the statistical amount parameter management table 410.

In S704, the processor 102 calls the statistical amount setting program 401.

In S705, the processor 102 calls the loss setting program 402.

After S705, the processor 102 ends the initial setting operation program 400 (S706).

Figure 8:
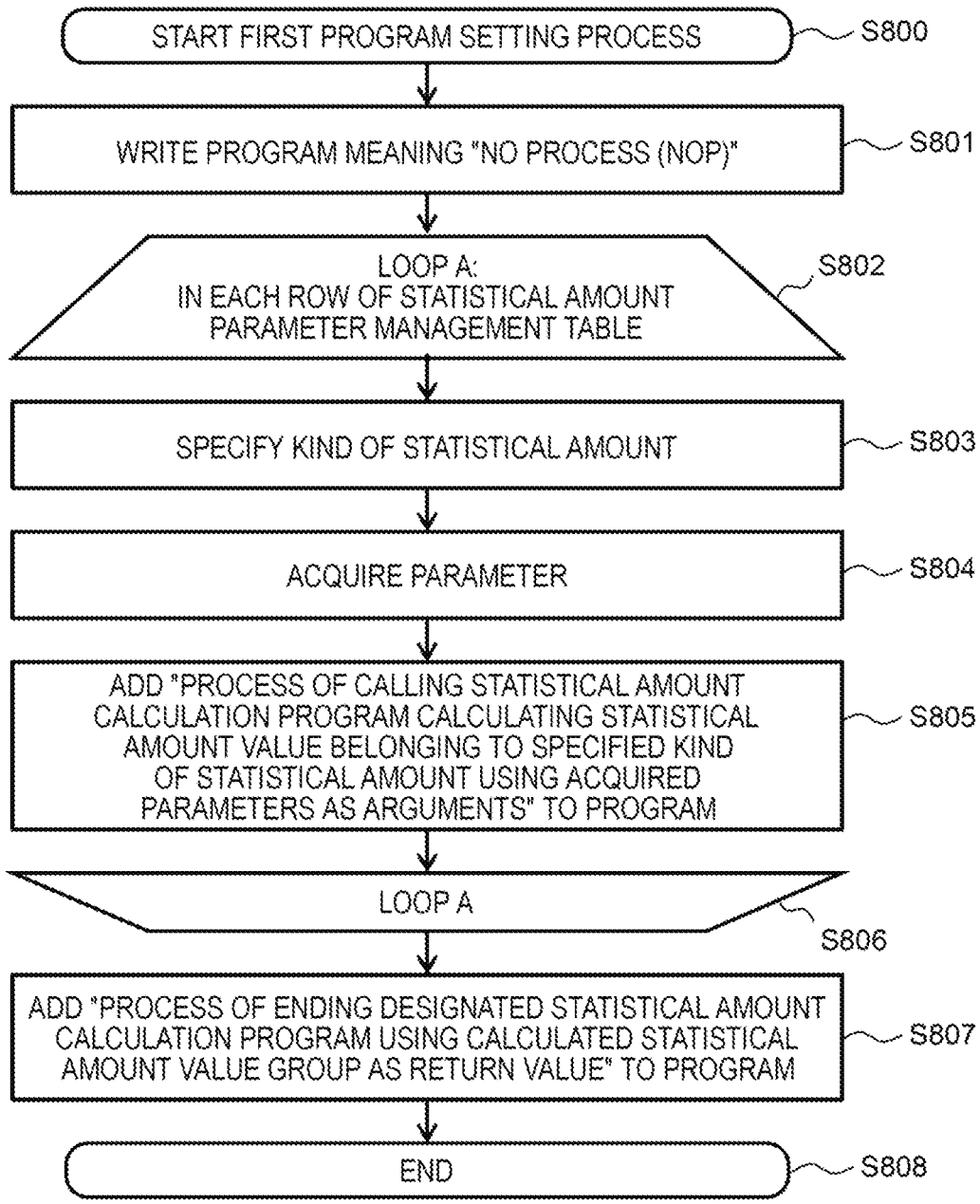
FIG. 8 is a flowchart illustrating a first program setting process.

FIG. 8 is a flowchart illustrating a first program setting process.

The first program setting process is performed by the statistical setting program 401. The statistical setting program 401 starts by being called in S704 of FIG. 7 (S800).

In S801, the processor 102 initializes the designated program area by writing a program meaning "NO process (NOP)" in the designated program area (one area in the RAM 104) (not illustrated).

S802 to S806 are performed for each row 501 of the statistical amount parameter management table 410. Hereinafter, one row 501 is taken as an example (referred to as a "loop target row" in the description of FIG. 8).

In S803, the processor 102 specifies a kind of statistical amount from the column 502 of the loop target row of the statistical amount parameter management table 410.

In S804, the processor 102 acquires the parameters of the statistical amount from the columns 503 of the loop target row of the statistical amount parameter management table 410.

In S805, the processor 102 adds "a process of calling the statistical amount calculation program 407 calculating the statistical amount value belonging to the kind of statistical amount specified in S803 using the parameters acquired in S804 as arguments" to the program (the program written in S801) in the designated program area.

In S807, the processor 102 adds "a process of ending the designated statistical amount calculation program 406 using the statistical amount value group (one or more statistical amount values) calculated in S805 as a return value" to the program (the program added in S805) in the designated program area.

After S807, the processor 102 ends the statistical setting program 401 (S808).

Thus, the designated statistical amount calculation program 406 is generated in the designated program area.

Figure 9:
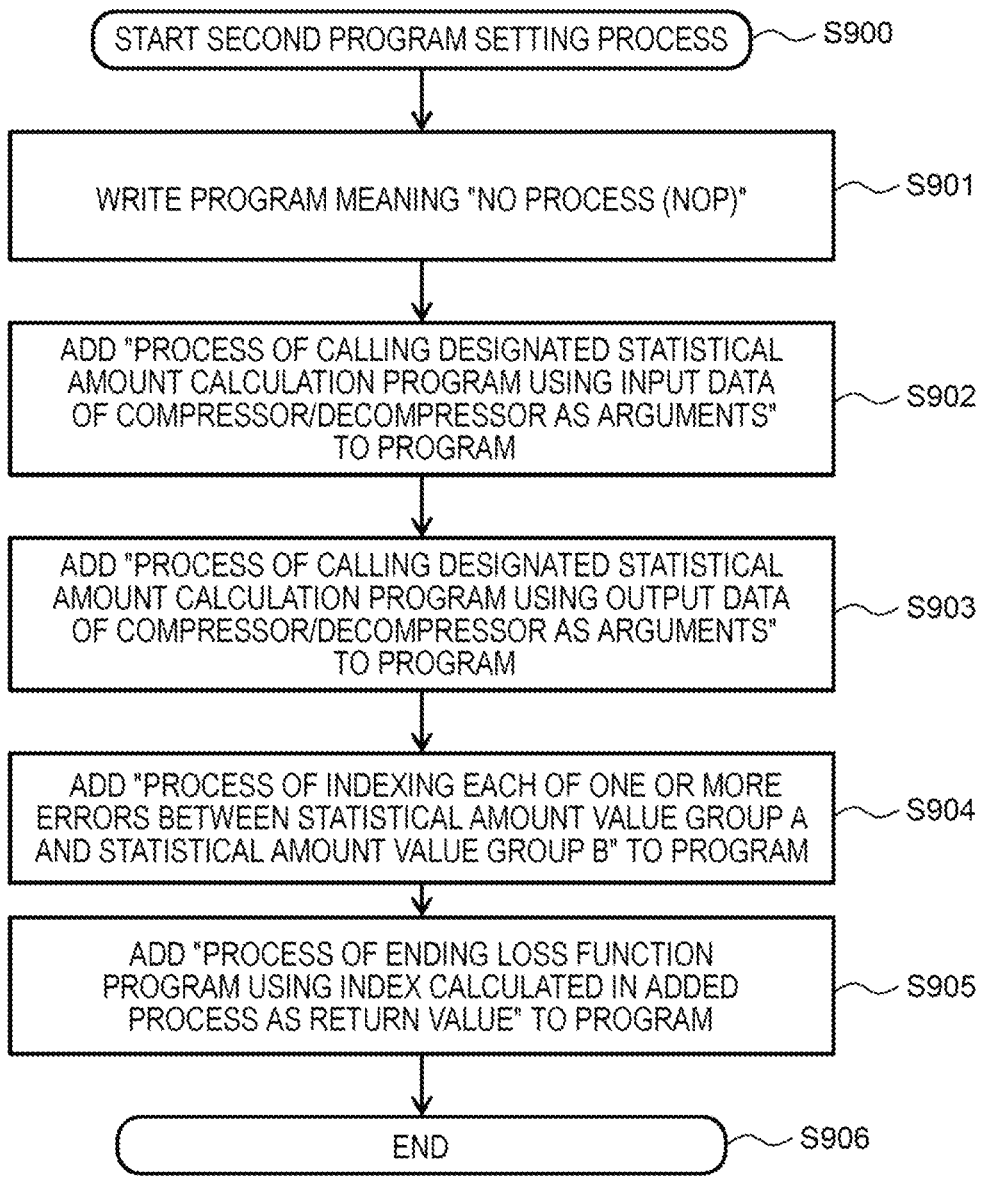
FIG. 9 is a flowchart illustrating a second program setting process.

FIG. 9 is a flowchart illustrating a second program setting process.

The second program setting process is performed by the loss setting program 402. The loss setting program 402 is started by being called in S705 of FIG. 7 (S900).

In S901, the processor 102 writes a program indicating "NO process (NOP)" in a loss function program area (one area in the RAM 104) and initializes the loss function program area.

In S902, the processor 102 adds "a process of calling the designated statistical amount calculation program 406 using the input data of the compressor/decompressor as arguments" to the program (the program written in S901) in the loss function program area.

In S903, the processor 102 adds "a process of calling the designated statistical amount calculation program 406 using the output data of the compressor/decompressor as arguments" to the program (the program added in S902) in the loss function program area.

In S904, the processor 102 adds "a process of indexing each of one or more errors of an error group between a statistical amount value group A which is a statistical amount value group calculated in the process added in S902 and a statistical amount value group B which is a statistical amount value group calculated in the process added in S903" to the program (the program added in S903) in the loss function program area. As the example of the indexing method, a mean square error between the statistical amount value group A and the statistical amount value group B can be exemplified. An indexing method is not limited thereto and any method can be used as long as a function that calculates a scalar value from two groups of the statistical amount groups formed by a plurality of statistical amounts is used. The indexing method may not be statically set in the storage node 100 and the management server 130 may allow the user to designate an indexing method via the statistical amount parameter setting screen 200. For example, the user may be allowed to designate an indexing method $f\_n$ of an error and a target value $g\_n$ with regard to each statistical amount n via the statistical amount parameter setting screen 200, a statistical amount value $a\_n$ of the statistical amount value group A and a statistical amount value $b\_n$ of the statistical amount value group B are indexed ($f\_n (a\_n, b\_n)$) in accordance with a method of designating the error, the indexed value and a maximum value max ($f\_n (a\_n, b\_n)$, $g\_n$) of the target value $g\_n$ are obtained, and a sum Sum (max ($f\_n (a\_n, b\_n)$, $g\_n$)) of all the statistical amounts of the values can be set as an index of a final error. At this time, a value of the loss function does not decrease even when the compressor/decompressor is learned so that the error index $f\_n (a\_n, b\_n)$ of each statistical amount is less than the target value $g\_n$. Therefore, the neural network included in the compressor/decompressor is learned so that another statistical amount other than a statistical amount of which an error index is already less than a target value or the error index $f\_n (a\_n, b\_n)$ of an error of a statistical amount n at another time is improved. Thus, it is possible to increase a ratio of a statistical amount to a time at which an unbalance of an error by the time or the statistical amount is suppressed and an error target designated by the user is satisfied. The statistical amount values $a\_n$ and $b\_n$ may be vectors that have lengths in a time direction and correspond to each kind of statistical amount or may be values at that time. When data at each time of time-series data is a tensor of an image or the like, the tensor may be divided into smaller tensors, an error of each sub-tensor may be calculated, and a maximum value with respect to the target value may be extracted. For example, for time-series data formed by a plurality of images, each image can be partitioned into patches and quality (for example, a peak signal-to-noise ratio or multi-scale structured similarity) between a patch $a\_n$ of an original image and a patch $b\_n$ of a post-compression or decompression image can be set to $f\_n$ for each patch. At this time, by using the loss function defined in accordance with the foregoing method, it is possible to learn the compressor/decompressor so that quality between the images and between patches of the image is uniform near a target value.

A term for improving a compression ratio, for example, a term representing entropy of an output of the compressor, is added to the loss function in some cases in addition to a term representing an error. In these cases, trade-off between a compression ratio and an error can be adjusted in accordance with a ratio of a term of the error to a term of the compression ratio, that is, a coefficient multiplied to the term of the compression ratio (hereinafter referred to as a compression coefficient). In general, the compression coefficient is manually set. However, according to an embodiment of the invention, the compression coefficient is controlled such that a small value is set as the compression coefficient when there is a statistical amount of which an error is less than a target value, and a large value is set as the compression coefficient in the other cases. In this way, learning in which minimization of the error is prioritized until the error satisfies the target. On the other hand, after the target is achieved, learning in which improvement in the compression ratio is prioritized is performed so that the compressor/decompressor optimum for the user can be obtained in terms of the trade-off between the error and the compression ratio. Thus, it is possible to obtain the effect of optimizing the compression ratio within a range in which the error of the statistical amount designated by the user is less than the designated target value.

In S905, the processor 102 adds "a process of ending the loss function program 408 using the index calculated in the process added in S904 as a return value" to the program (the program added in S904) in the loss function program area.

After S905, the processor 102 ends the loss setting program 402 (S906).

In this way, the loss function program 408 is generated in the loss function program area.

As described above, the loss function program 408 set in the steps of FIG. 9 is a program that receives input data and output data of the compressor/decompressor as inputs and outputs an error between the two inputs with respect to the statistical amount input to the statistical amount parameter setting screen 200 by the user.

In the flowchart of FIG. 9, the loss function program 408 is set so that the error of the statistical amount designated by the user is calculated as the loss function. However, the processor 102 may add a process of adding an index other than an error of a statistical amount, such as a mean square error between input data and output data of the compressor/decompressor or an amount of post-compression data to an error of a statistical amount, to the loss function program area. Thus, it is possible to reflect such an index to the loss function.

(5) Data Writing Process

Figure 10:
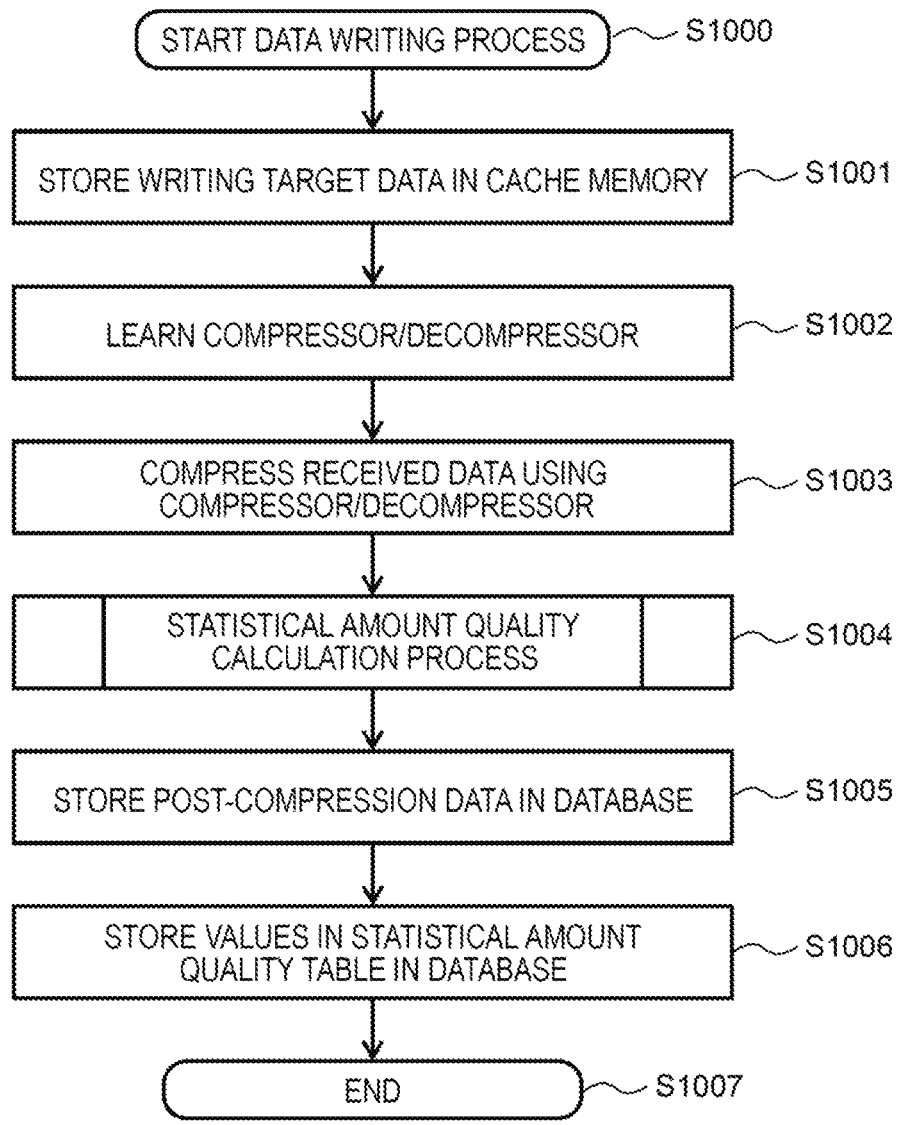
FIG. 10 is a flowchart illustrating a data writing process.

FIG. 10 is a flowchart illustrating data writing process. The data writing process is performed by the data writing program 403. The processor 102 starts the data writing program 403 using reception of data written from the sensor server 120 by the front-end interface 101 of the storage node 100 as a trigger (S1000).

In S1001, the processor 102 stores the writing target data received by the front-end interface 101 in the cache memory 103.

In S1002, the processor 102 learns a neural network included in the compressor/decompressor in accordance with the compression/decompression program 420. As learning data, sensor data stored in the cache memory 103 in S1001 is used. A value of the loss function is calculated by executing the loss function program 408 using a pair of the original data (the sensor data in the cache memory 103) and the decompressed data (the output data obtained from the compressor/decompressor when the original data is an input of the compressor/decompressor) as an argument. When a backward error propagation method is used as a learning algorithm of the neural network, a value of a gradient in the loss function may be calculated by generally known automatic differentiation or may be calculated by generating a program that calculates a partial differential value in the loss setting program 402 and executing the program. S1002 may be skipped and the compressor/decompressor learned in previous S1002 may be reused in a subsequent step.

In S1003, the processor 102 compresses the sensor data stored in the cache memory 103 in S1001 using the compressor/decompressor learned in S1002 through a compression function provided by the compression/decompression program 420. The post-compression data includes all kinds of information necessary to decompress data. The information included in the post-compression data differs depending on a type of the compressor/decompressor. For example, when the compressor/decompressor is configured by an autoencoder, a value of a parameter of a decoder and a value of an intermediate vector are included in the post-compression data.

In S1004, the processor 102 calls the statistical amount quality calculation program 405 using the post-compression data obtained in S1003 as an argument.

In S1005, the processor 102 registers the post-compression data obtained in S1003 in a database provided by the database program 409.

In S1006, the processor 102 acquires all the values of the statistical amount quality from the statistical amount quality management table 411 and registers the values in the database provided by the database program 409.

After S1006, the processor 102 ends the data writing program 403 (S1007).

Figure 11:
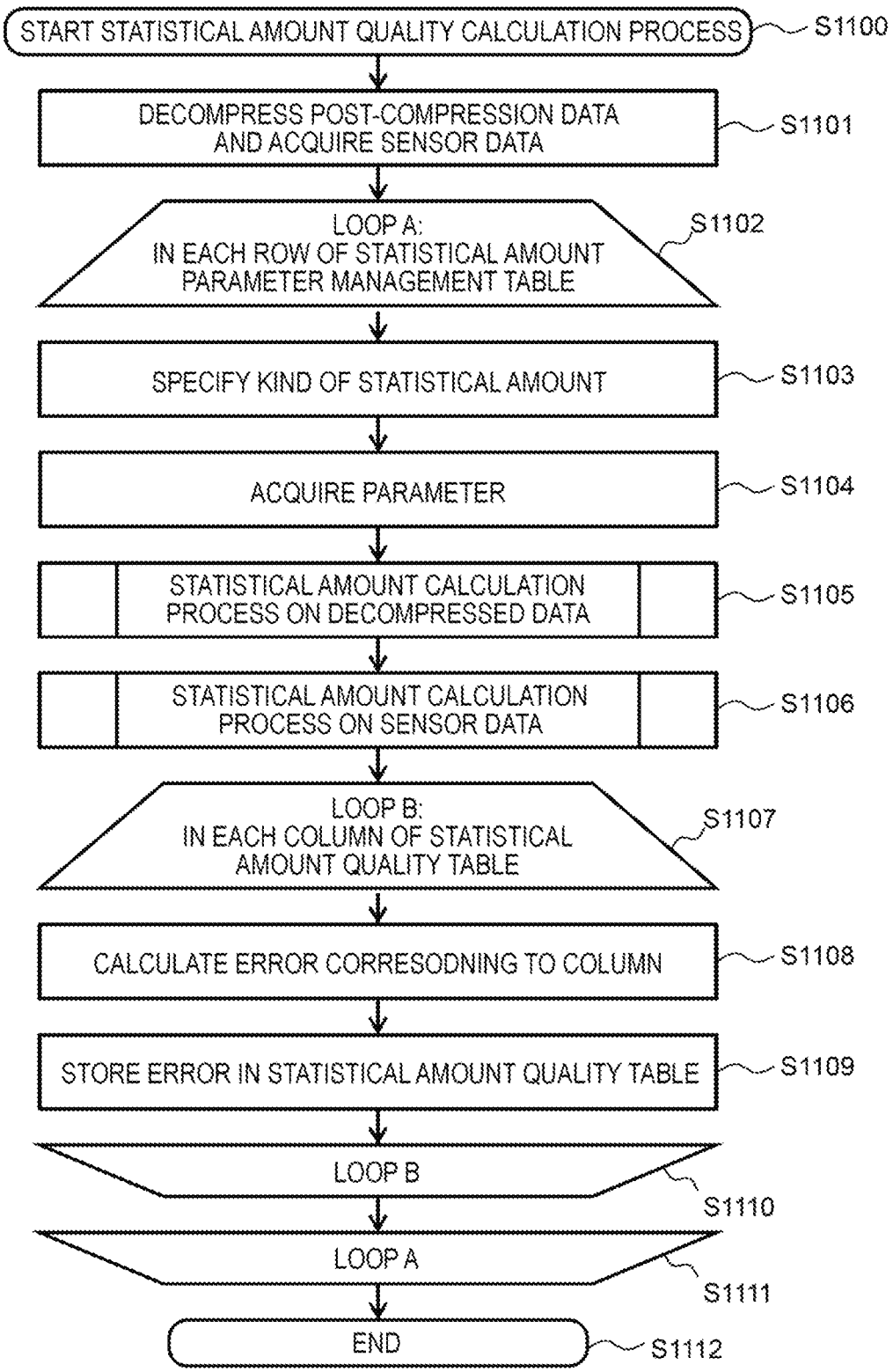
FIG. 11 is a flowchart illustrating a statistical amount quality calculation process.

FIG. 11 is a flowchart illustrating a statistical amount quality calculation process.

The statistical amount quality calculation process is performed by the statistical amount quality calculation program 405. The statistical amount quality calculation program 405 is started by being called in S1004 of FIG. 10 (S1100).

In S1101, the processor 102 decompresses the sensor data from the post-compression data given as an argument using a decompression function provided by the compression/decompression program 420. A method of decompressing the sensor data differs depending on a type of the compressor/decompressor. For example, when the compressor/decompressor is configured by an autoencoder, the sensor data is obtained by inputting a value of an intermediate vector included in the post-compression data to a decoder in which values of parameters included in the post-compression data are set.

S1102 to S1111 are performed for each row 501 of the statistical amount parameter management table 410. Hereinafter, one row 501 is taken as an example (referred to as a "loop target row" in the description of FIG. 11).

In S1103, the processor 102 specifies a kind of statistical amount from the columns 502 of the loop target row of the statistical amount parameter management table 410.

In S1104, the processor 102 acquires parameters of the statistical amount from the columns 503 of the loop target row of the statistical amount parameter management table 410.

In S1105, the processor 102 calls the statistical amount calculation program 407 corresponding to the kind of statistical amount specified in S1103 by setting the sensor data decompressed in S1101 and the parameters acquired in S1104 as arguments.

In S1106, the processor 102 calls the statistical amount calculation program 407 corresponding to the kind of statistical amount specified in S1103 by setting the sensor data in the cache memory 103 and the parameters acquired in S1104 as arguments.

S1107 to S1110 are performed for each column 602 of the statistical amount parameter management table 411. Hereinafter, one column 602 is taken as an example (referred to as a "loop target column" in the description of FIG. 11).

In S1108, the processor 102 calculates an error corresponding to the index corresponding to the loop target column from the tensor of the statistical amount calculated in S1105 and the tensor of the statistical amount calculated in S1106. For example, when the loop target column is a column representing "mean square error," the processor 102 calculates a mean square error between two tensors.

In S1109, the processor 102 stores the error calculated in S1108 in the loop target column 602 of the row 601 corresponding to the loop target row in the statistical amount quality management table 411.

When the loop of S1102 to S1111 ends, the processor 102 ends the statistical amount quality calculation program 405 (S1112).

(6) Sensor Data Reading Process

Figure 12:
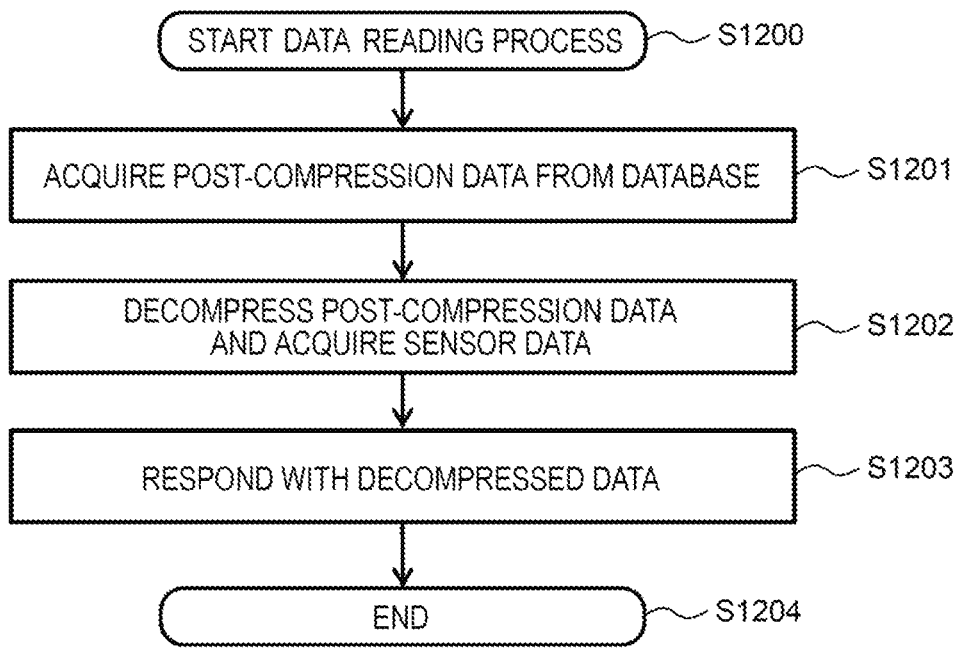
FIG. 12 is a flowchart illustrating a data reading process.

FIG. 12 is a flowchart illustrating a data reading process. The data reading process is performed by the data reading program 404. The processor 102 starts the data reading program 404 using reception of a data reading request by the front-end interface 101 from a computer such as the sensor server 120 or the management server 130 as a trigger (S1200). A source of the data reading request is not limited to the sensor server 120 and the management server 130 and may be any computer connected to the storage node 100 via the switch 140.

In S1201, the processor 102 analyzes the reading request received by the front-end interface 101 and acquires reading target post-compression data from the database provided by the database program 409.

In S1202, the processor 102 decompresses the sensor data from the post-compression data acquired in S1201 using the decompression function provided by the compression/decompression program 420. A method of decompressing the sensor data differs depending on a type of the compressor/decompressor. For example, when the compressor/decompressor is configured by an autoencoder, the sensor data is obtained by inputting a value of an intermediate vector included in the post-compression data to a decoder in which values of parameters included in the post-compression data are set.

In S1203, the processor 102 responds to the computer of the request source via the front-end interface 101 with the sensor data decompressed in S1202.

After S1203, the processor 102 ends the data reading program 404 (S1204).

(7) Statistical Amount Quality Responding Process

When the user presses the display button 302 on the statistical amount quality checking screen 300, the management server 130 transmits a request for statistical amount quality to the storage node 100 along with a value set in the data ID input field 301.

The processor 102 starts a process of responding to the management server 130 with the statistical amount quality using reception of the request of the statistical amount quality by the front-end interface 101 of the storage node 100 as a trigger.

First, the processor 102 acquires a data ID received by the front-end interface 101. Subsequently, of the information regarding the statistical amount quality registered in the database in S1006, the processor 102 acquires information corresponding to the ID from the database provided by the database program 409. Subsequently, the processor 102 responds to the management server 130 with the statistical amount quality acquired from the database via the front-end interface 101.

When the management server 130 receives the response from the storage node 100, the management server 130 displays the value of the received statistical amount quality in the statistical amount quality field 303 of the statistical amount quality checking screen 300.

The statistical amount quality responding process may be performed, for example, when at least one of the data reading program 404 and the statistical amount quality calculation program 405 is executed by the processor 102.

The storage system according to the embodiment of the invention has been described above.

Figure 13:
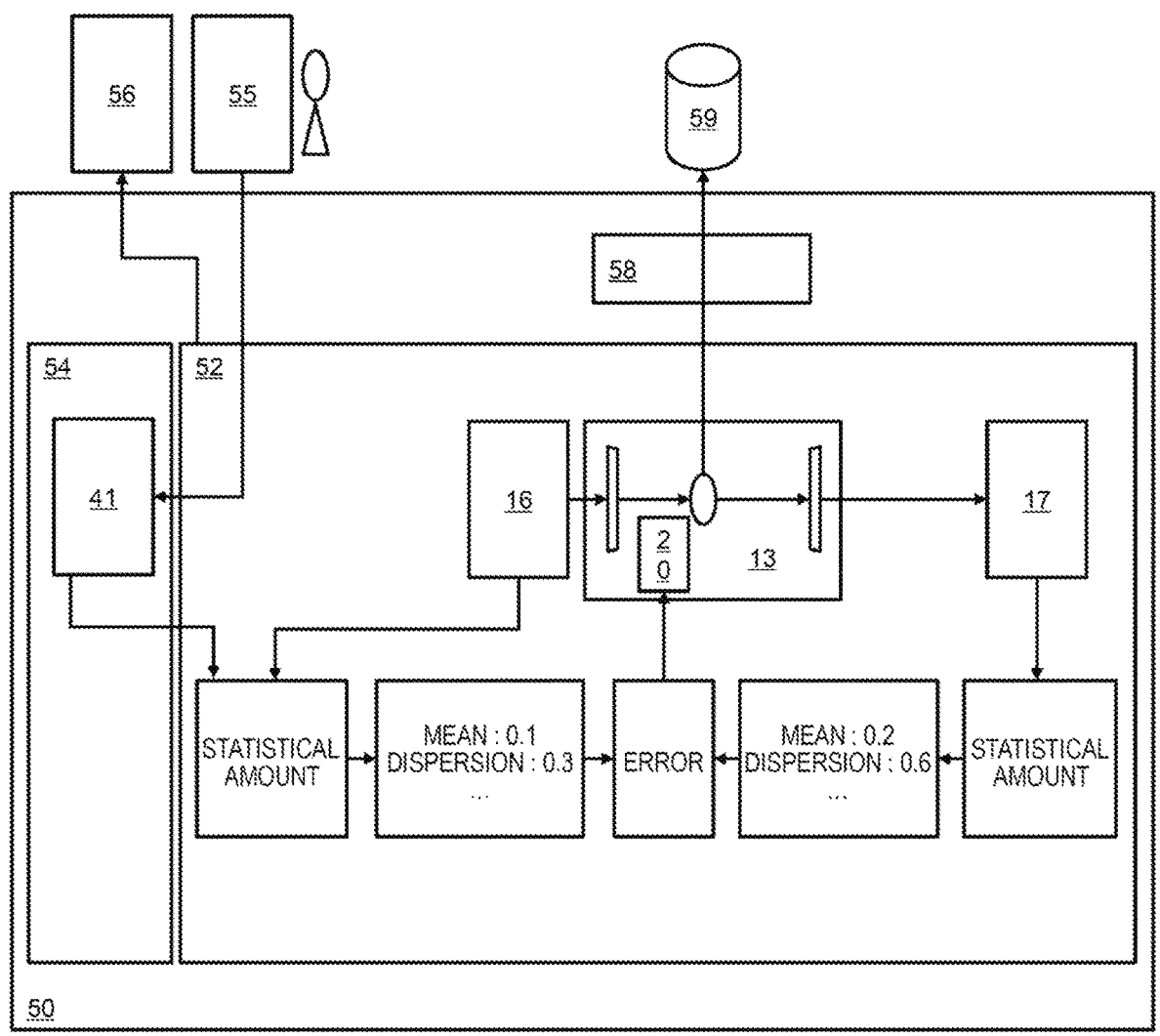
FIG. 13 is a schematic diagram illustrating an example of an overview of the storage system.

The above description can be summarized as follows with reference to, for example, FIG. 13.

The storage system 50 includes the interface device 58 (for example, the back-end interface 107) connected to the storage device 59 (for example, the drive 150); and the processor 52 (for example, the processor 102) configured to perform irreversible compression on time-series data (for example, sensor data) using the compressor/decompressor 13 based on machine learning and store post-compression data which is time-series data subjected to the irreversible compression in the storage device 59. An input to the compressor/decompressor 13 is the original data 16 which is pre-compression time-series data, and an output of the original data 16 from the compressor/decompressor is the decompressed data 17 which is data obtained by decompressing the post-compression data of the original data 16. For each of one or more kinds of statistical amounts, the processor 52 provides the first interface 55 that is an interface receiving an input of one or more parameters necessary to calculate the statistical amount. The machine learning of the compressor/decompressor 13 is performed on each of one or more kinds of statistical amounts based on one or more parameters input via the first interface 55. The post-compression data of the original data 16 is compressed using the compressor/decompressor 13 after the machine learning, and the post-compression data of the original data 16 is stored in the storage device 59. Thus, information that has no influence on accuracy requisite which is accuracy of a statistical amount which is calculated based on the parameters designated via the first interface 55 (that is, information other than the information necessary to calculate the statistical amount) can be excluded from a compression result (the post-compression data). That is, the post-compression data by the compressor/decompressor 13 learned based on the parameters designated via the first interface 55 does not include the information that has no influence on accuracy requisite of the statistical amount. Therefore, the compression ratio is improved more than in the comparative example in relation to the same accuracy requisite of the statistical amount.

For example, in irreversible compression of the sensor data, information such as a statistical amount in which the application is necessary differs for each piece of data. However, the above-described storage system 50 can control the statistical amount remaining in the compression result based on designation of the user.

The above-described storage system 50 can also be applied to irreversible compression of time-series data other than the sensor data, for example, sound data. For example, the first interface 55 may receive a parameter in a kind of statistical amount "power spectrum" (frequency: 100 Hz to 200 Hz).

The processor 52 manages the management information 41 (for example information including the statistical amount parameter management table 410) including one or more parameters input via the first interface with regard to each of the one or more kinds of statistical amounts. Thus, it is possible to manage one or more parameters for each kind of statistical amount. The storage system 50 may include, for example, the memory 54 (for example, the RAM 104) and the memory 54 may store the management information 41.

The processor 52 calculates a statistical amount value of each of the one or more kinds of statistical amounts based on one or more parameters input via the first interface 55 in relation to the original data 16. The processor 52 calculates a statistical amount value of each of the one or more kinds of statistical amounts based on the one or more parameters input via the first interface 55 in relation to the decompressed data 17 corresponding to the original data 16. The machine learning of the compressor/decompressor 13 is performed based on the statistical amount value calculated for each of one or more kinds of statistical amounts in relation to the original data 16 and the statistical amount value calculated for each of one or more kinds of statistical amounts in relation to the decompressed data 17. In this way, it is possible to perform the machine learning of the compressor/decompressor 13 based on one or more parameters input via the first interface 55.

The machine learning of the compressor/decompressor 13 is performed based on the objective function 20 set in the compressor/decompressor 13. With regard to each of one or more statistical amounts, the processor 52 sets one or more kinds values (errors) regarding the difference between the statistical amount value calculated for each of the one or more kinds of statistical amounts in relation to the original data 16 and a statistical amount value calculated for each of the one or more kinds of statistical amounts in relation to the decompressed data 17 in the objective function 20 of the compressor/decompressor 13. As an example of the objective function 20, there is a loss function. In general, a mean of an error between times is used in the loss function. However, there is no method of uniformizing the error between the times. Therefore, there is a problem that a variation occurs in the error for each time. In addition, a term for improving a compression ratio is added to the loss function in addition to a term representing an error in some cases. In these cases, trade-off between a compression ratio and an error can be adjusted in accordance with a ratio of terms of the error to a term of the compression ratio, that is, a coefficient multiplied to the term of the compression ratio (hereinafter referred to as a compression coefficient). However, a relation among the compression coefficient, the error, and the compression ratio is generally not known. To adjust this relation, many compressors/decompressors in which the compression coefficient is changed have to be learned, and thus it takes some time. According to the storage system 50, this problem is solved. That is, the variation in the error between the times or the statistical amounts can be reduced. For example, an interface (for example, a UI) that receives a target value of an error designated by a user may be provided. The loss function can be set or the compression coefficient can be automatically adjusted so that the compression ratio is optimized within a range in which the target value designated via the interface is satisfied.

One or more kinds of statistical amounts may include at least one of a mean and a dispersion. With regard to at least one kind of statistical amount among the one or more kinds of statistical amounts, one or more parameters may include the number of samples and a calculation frequency with regard to one kind of statistical amount. The parameters may be designated as parameters necessary to calculate the statistical amount.

The processor 102 may provide the second interface 56 which is an interface that displays statistical amount quality conforming to a difference between the statistical amount value calculated for each of the one or more kinds of statistical amounts in relation to the original data 16 and the statistical amount value calculated for each of the one or more kinds of statistical amounts in relation to the decompressed data 17 obtained by decompressing the post-compression data of the compressor/decompressor after the machine learning. Thus, the user can know the statistical amount quality obtained from the data 17 compressed and decompressed by the compressor/decompressor 13 after the machine learning. The statistical amount quality may be one or more kinds of values regarding the difference between the statistical amount value calculated for each of the one or more kinds of statistical amounts in relation to the original data 16 and the statistical amount value calculated for each of the one or more kinds of statistical amounts in relation to the decompressed data 17 of the post-compression data of the original data 16.

The kind of statistical amount may be designated via the first interface 55. Thus, it is possible to designate information necessary to calculate the statistical amount more accurately.

The embodiment has been described above. The embodiment is exemplary to describe the invention and the scope of the invention is not limited to the embodiment. The invention can be embodied in other various forms.

What is claimed is:

1. A storage system comprising:
an interface device connected to a storage device, the storage system compressing sensor data and storing the compressed sensor data in the storage device; and
a processor configured to perform irreversible compression on time-series data using a compressor/decompressor based on machine learning and store post-compression data which is time-series data subjected to the irreversible compression in the storage device,
wherein an input to the compressor/decompressor is original data which is pre-compression time-series data, and an output of the time-series data from the compressor/decompressor is decompressed data which is data obtained by decompressing the post-compression data of the time-series data,
wherein machine learning of the compressor/decompressor is performed on each of one or more kinds of statistical amounts based on one or more parameters, the time-series data is compressed using the compressor/decompressor after the machine learning, and the post-compression data of the time-series data is stored in the storage device, and
wherein the processor calculates a statistical amount value of each of the one or more kinds of statistical amounts based on the one or more parameters in relation to the original data, and calculates a statistical amount value of each of the one or more kinds of statistical amounts based on the one or more parameters in relation to the decompressed data corresponding to the original data, and
wherein the machine learning of the compressor/decompressor is performed by comparing the statistical amount value calculated for each of the one or more kinds of statistical amounts in relation to the original data and the statistical amount value calculated for each of the one or more kinds of statistical amounts in relation to the decompressed data, to exclude from a compression result information that has no influence on accuracy of statistical amount which is calculated based on parameters designated via an interface receiving an input of one or more parameters necessary to calculate each statistical amount of the one or more kinds of statistical amounts.

2. The storage system according to claim 1, wherein the machine learning of the compressor/decompressor is performed based on an objective function set in the compressor/decompressor, and wherein, with regard to each of the one or more kinds of statistical amounts, the processor sets one or more kinds of values regarding a difference between the statistical amount value calculated for each of the one or more kinds of statistical amounts in relation to the original data and the statistical amount value calculated for each of the one or more kinds of statistical amounts in relation to the decompressed data in an objective function of the compressor/decompressor.

3. The storage system according to claim 1, wherein the one or more kinds of statistical amounts include at least one a mean and a dispersion, and
wherein, with regard to at least one of kind of statistical amount among the one or more kinds of statistical amounts, the one or more parameters include a number of samples and a calculation frequency.

4. The storage system according to claim 1, wherein the processor provides a first interface which is the interface receiving an input of one or more parameters necessary to calculate each statistical amount of the one or more kinds of statistical amounts.

5. The storage system according to claim 4, wherein the processor manages information including one or more parameters input via the first interface with regard to each of the one or more kinds of statistical amounts.

6. The storage system according to claim 4, wherein the processor:
calculates a statistical amount value of each of the one or more kinds of statistical amounts based on one or more parameters input via the first interface in relation to the original data;
calculates a statistical amount value of each of the one or more kinds of statistical amounts based on the one or more parameters input via the first interface in relation to decompressed data corresponding to post-compression data of the compressor/decompressor after the machine learning; and
provides a second interface which is an interface displaying statistical amount quality that conforms to a difference between a statistical amount value calculated for each of the one or more kinds of statistical amounts in relation to the original data and a statistical amount value calculated for each of the one or more kinds of statistical amounts in relation to the decompressed data.

7. The storage system according to claim 6, wherein the statistical amount quality is one or more kinds of values regarding the difference between the statistical amount value calculated for each of the one or more kinds of statistical amounts in relation to the original data and a statistical amount value calculated for each of the one or more kinds of statistical amounts in relation to the decompressed data.

8. The storage system according to claim 4, wherein the kind of statistical amount is a kind of statistical amount designated via the first interface.

9. A storage control method of a storage system that compresses sensor data and stores the compressed data in a storage device, the method comprising:
calculating a statistical amount value of each of one or more kinds of statistical amounts based on one or more parameters in relation to original data which is time-series data input to a compressor/decompressor which is used for irreversible compression and is based on machine learning;
calculating a statistical amount value of each of the one or more kinds of statistical amounts based on the one or more kinds of parameters in relation to decompressed data which is output from the compressor/decompressor and corresponds to the original data; and performing the machine learning of the compressor/decompressor by comparing the statistical amount value calculated for each of the one or more kinds of statistical amounts in relation to the original data and the statistical amount value calculated for each of the one or more kinds of statistical amounts in relation to the decompressed data, to exclude from a compression result information that has no influence on accuracy of statistical amount which is calculated based on parameters designated via an interface receiving an input of one or more parameters necessary to calculate each statistical amount of the one or more kinds of statistical amounts.

* * * * *